United States Patent [19]

Chisholm

[11] 4,372,044

[45] Feb. 8, 1983

[54] METHOD OF AND APPARATUS FOR STRAIGHTENING TERMINAL PINS

[75] Inventor: William M. Chisholm, Midlothian, Va.

[73] Assignee: Western Electric Company, Inc., New York, N.Y.

[21] Appl. No.: 202,805

[22] Filed: Oct. 31, 1980

[51] Int. Cl.³ .................. H05K 3/22; B23P 19/00; B21F 1/02

[52] U.S. Cl. ......................... 29/845; 29/747; 140/147

[58] Field of Search .............. 29/739, 747, 755, 759, 29/837, 838, 842, 845; 140/147, 149

[56] References Cited

U.S. PATENT DOCUMENTS

| | | | |
|---|---|---|---|
| 3,580,297 | 5/1971 | Spadoni | 140/149 |
| 3,603,357 | 9/1971 | Drummond | 140/147 |
| 3,687,172 | 8/1972 | Suverkropp | 140/147 |
| 3,700,011 | 10/1972 | Walter | 140/147 |
| 3,730,234 | 5/1973 | Hesselmann | 140/147 |
| 3,742,987 | 7/1973 | Tarbox et al. | 140/147 |
| 3,779,291 | 12/1973 | Yeo | 140/147 |
| 3,903,937 | 9/1975 | Drummond | 140/147 |
| 4,216,580 | 8/1980 | Chisholm | 29/842 |
| 4,219,053 | 8/1980 | Tyner et al. | 140/147 |

OTHER PUBLICATIONS

Mass Pin Straightening for Circuit-Pack Backplanes, Chisholm et al., Western Electric Engineer, Fall 1980, pp. 35-40.

*Primary Examiner*—Ervin M. Combs
*Attorney, Agent, or Firm*—J. B. Hoofnagle; D. D. Bosben

[57] ABSTRACT

First end portions (22c) of terminal pins (22) are gripped in a gripping means (54) on one side of a substrate (24) and intermediate portions (22cs) of the pins then are inserted into the substrate. In the insertion operation, second opposite end portions (22i) of the pins are extended into a straightening means (74) on the opposite side of the substrate (24). Tip portions of the first pin end portions (22c) then are disposed in the gripping means (54) and tip portions of the second pin end portions (22i) are disposed in the straightening means (74). To straighten the pins (22), relative reciprocating movement then is caused between the pin intermediate portions (22cs) and the pin tip portions to flex and coldwork the first and second pin end portions (22c and 22i) in a lateral direction simultaneously.

19 Claims, 19 Drawing Figures

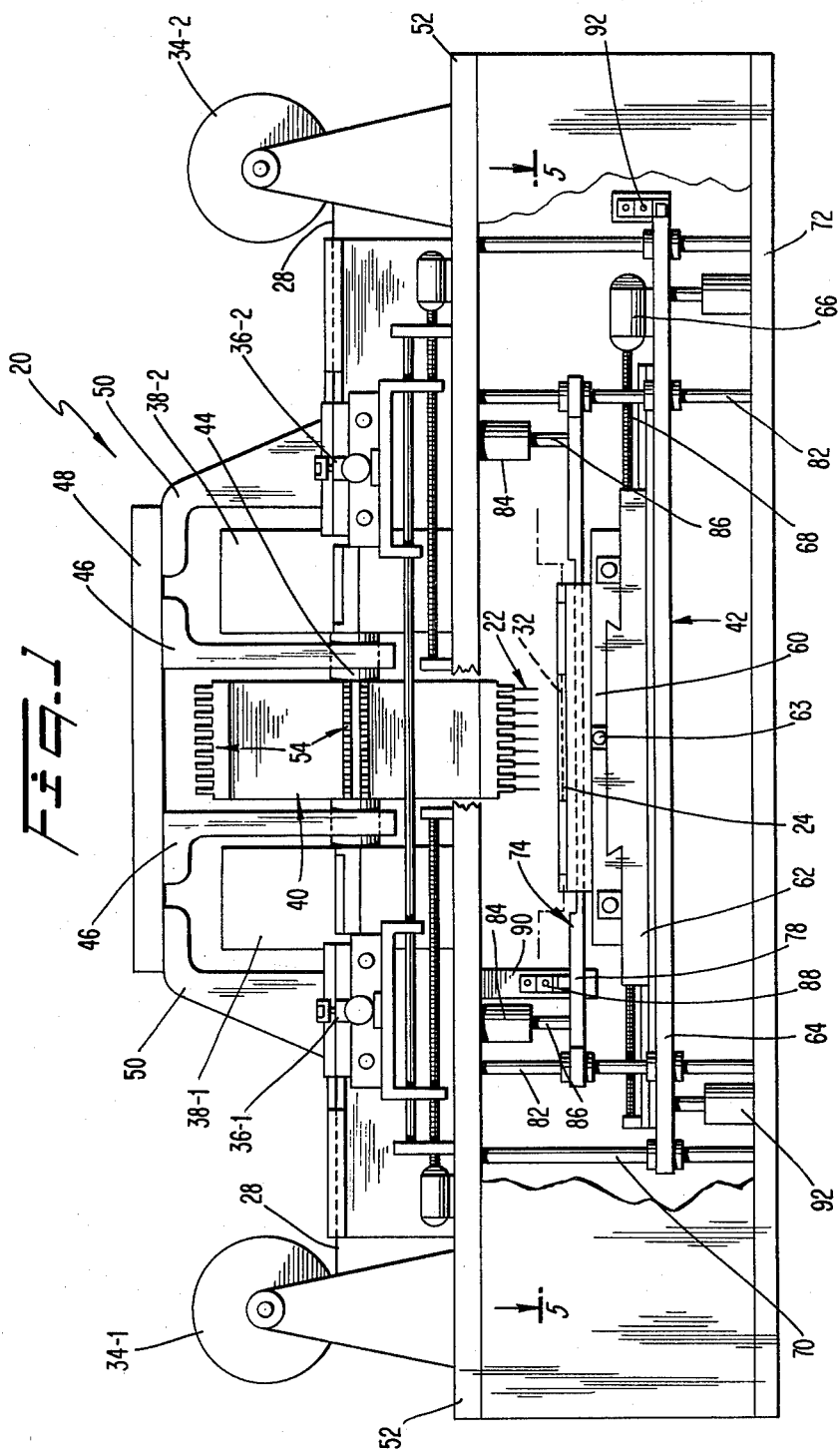

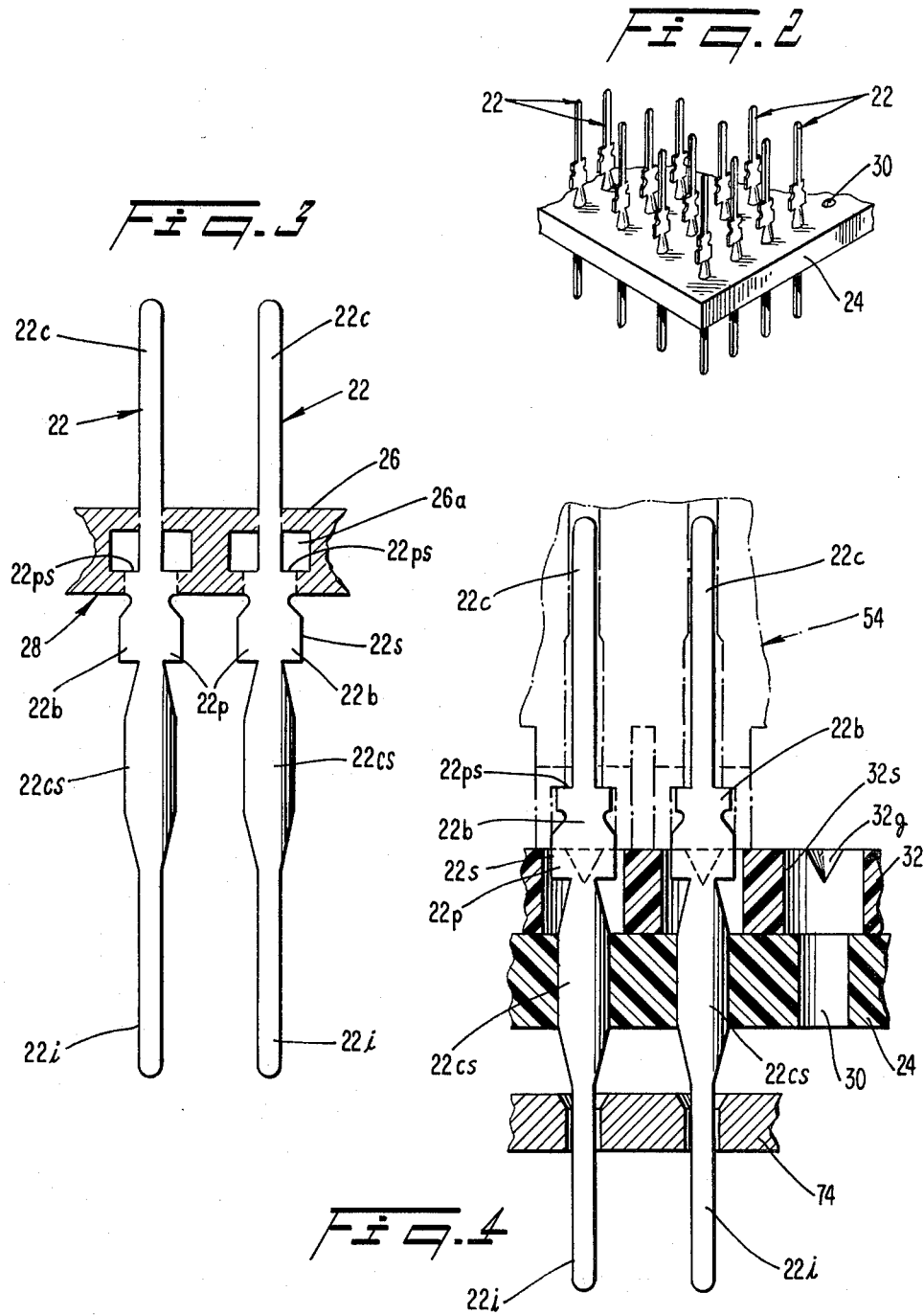

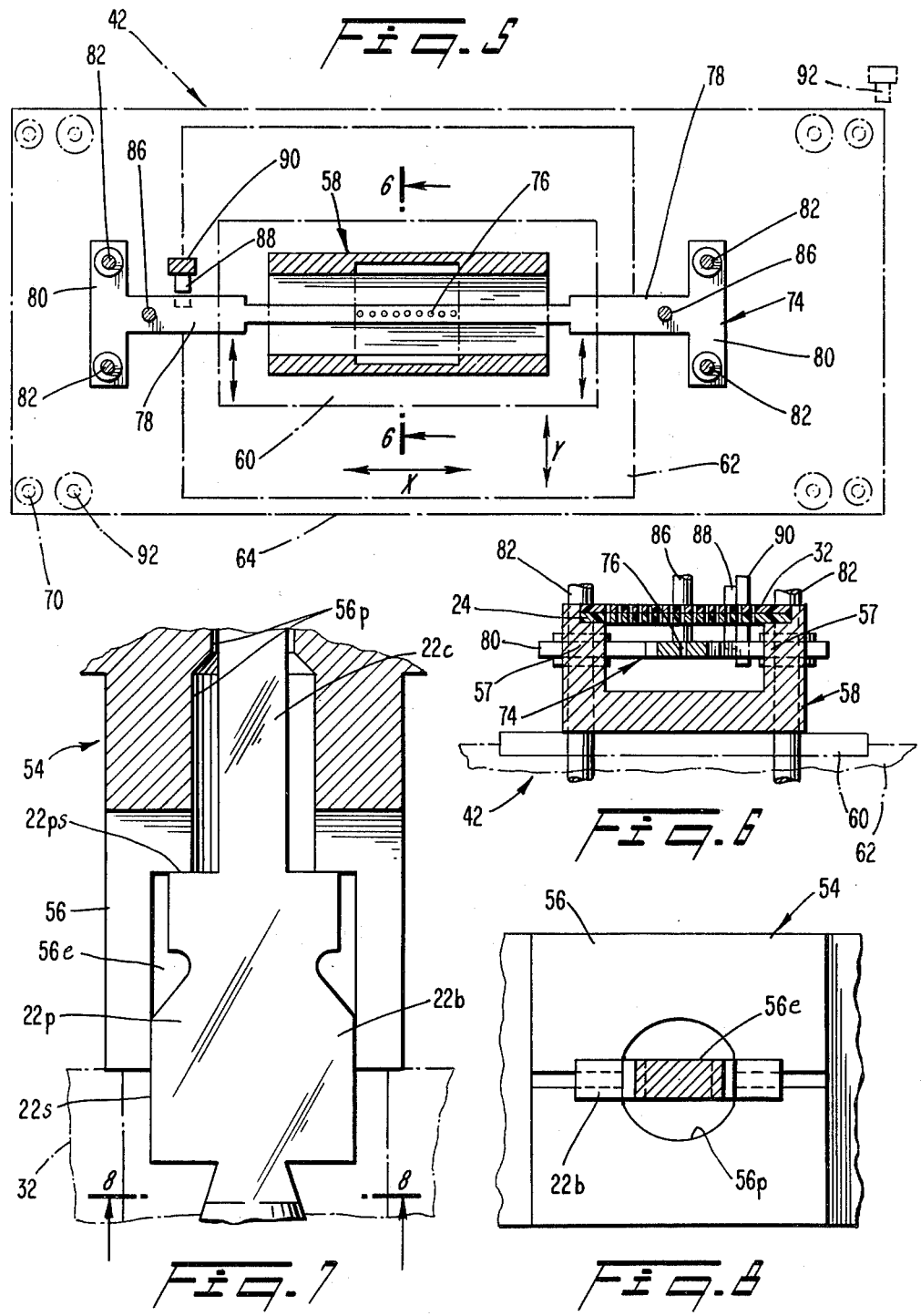

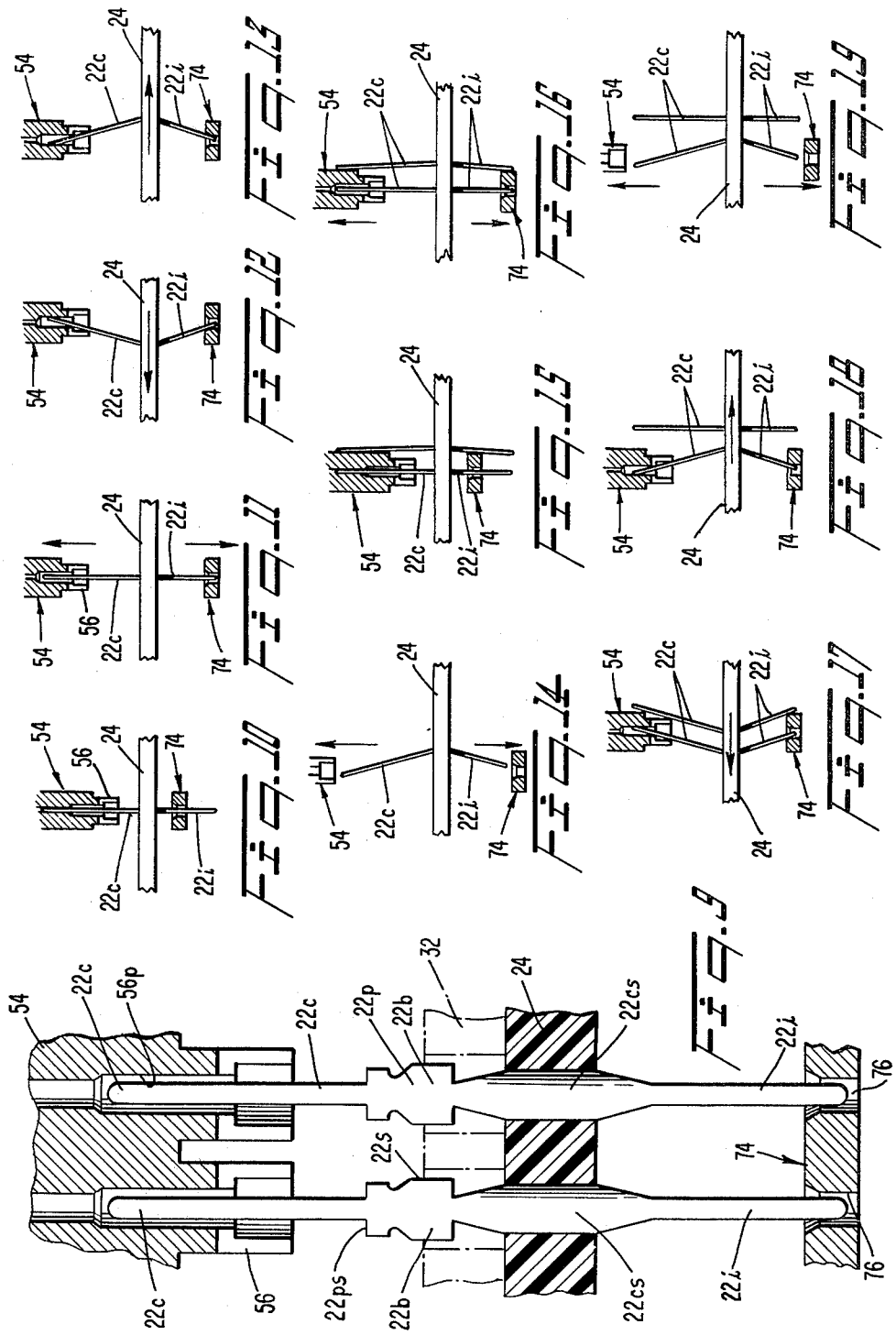

METHOD OF AND APPARATUS FOR STRAIGHTENING TERMINAL PINS

TECHNICAL FIELD

This invention relates to a method of and apparatus for straightening terminal pins. More particularly, this invention relates to a method of and apparatus for simultaneously straightening opposite ends of a plurality of terminal pins, in conjunction with the insertion of the terminal pins into a backplane or substrate.

BACKGROUND OF THE INVENTION

In the manufacture of some types of rigid pin-populated printed wiring boards, known as backplanes, as many as 10,000 terminal pins are inserted into rows of apertures of each of the boards. The pins electrically engage portions of printed wiring on the boards to provide for connections to external circuits. Typically, the spacing between adjacent apertures on each board is extremely small, such as 0.125 inch.

Each of the pins has slender opposite shank or end portions which extend from opposite sides of the boards. After the pins have been assembled with the board, the board is mounted in a frame where external wiring is wire wrapped to the shank or end portions of the pins on one side of the board commonly referred to as the wiring side. Other printed wiring boards, referred to as circuit packs, have electronic components electrically and mechanically secured thereto and have connectors secured to one end thereof. The connectors of these boards ultimately are inserted over selected ones of the shank portions of the pins extending from the other side of the board, commonly referred to as the component side.

During the insertion of the pins into the apertures of the board using a number of prior known methods and apparatus, some of the pins may be bent undesirably. For example, the most severely bent pins may deviate from an axial centerline by 0.050 inch in any direction. Consequently, adjacent pins which are bent in opposite directions could have a combined deviation swing of 0.100 inch.

Since the component side of the pins are destined for insertion into connectors, and the pins on the wiring side may be wired by an automatic wiring facility, it is important that the pins be axially straight and perpendicular to the plane of the board within an acceptable tolerance. Otherwise, a slightly bent pin on the component side, for example, could be misaligned with its mating aperture in the connector. Then, as the connector is moved into place, the bent pin would engage the face of the connector and would be bent further towards the surface of the board, thereby failing to provide the required electrical connection. Similarly, when the pins are wired by an automatic wiring facility, a bent pin could result in further bending of the pin by the facility, without the pin being wired, and/or jamming or damage to the facility.

Copending application Ser. No. 965,219, filed Nov. 30, 1978, and assigned to the same assignee, discloses an automated system for inserting pins into the board in a straight relationship, but because of inherent resiliency, previously bent pins that are inserted into the board will rebound to a non-straight position upon removal of the pins from the apparatus. Thus, the pins still must be straightened after insertion into the board.

Heretofore, various systems have been proposed for straightening shank or end portions of terminal pins projecting from one side of a board after all of the pins have been inserted in the board. For example, in order to provide for the straightening of pins located in a board on a grid spacing of 0.125 inch as above described, in one known pin straightening system a bar having a single row of pin-receiving apertures is lowered to position upper tip ends of a row of pins into the pin-receiving apertures of the bar. A conical lead-in portion for each aperture of the bar insures that drastically bent pins are received into the pin-receiving apertures. Thereafter, the bar is reciprocated in a plane of the row of pins which is referred to as the "X" direction. As the bar is reciprocated, the tip ends of the pins engage laterally spaced walls of the apertures whereby an upper projecting shank or end portion of each of the pins is flexed and coldworked, and then aligned in the "X" direction. In order to provide sufficient flexing and coldworking of the row of pins in a "Y" direction, a support table for the board then is reciprocated an amount such that upper end portions of the pins of the adjacent rows are bent by the sides of the bar away from the upper end portions of the pins located within the bar.

In order to compensate for this effect, the upper end portions of the pins of the first row of pins to be straightened are purposely not fully straightened in the "Y" direction but are left leaning slightly in the "Y" direction toward the adjacent or second row of pins, which is the next row to be straightened. The bar is then retracted and the support table is indexed in a "Y" direction so that the bar is positioned over the second row of pins, the upper end portions of which are then straightened properly in the "X" direction. Thereafter, the support table is reciprocated in the "Y" direction as above described between the first and a third row of pins.

As noted above, the upper end portions of the pins of the first row have been straightened in the "X" direction but are leaning slightly in the "Y" direction toward the second row of pins, the tip ends of which are now located within the apertures of the bar. As the support table is reciprocated in the "Y" direction, one side of the bar engages the slightly bent upper end portions of the pins of the first row and bends the pins in the "Y" direction so that the upper end portions of the pins are now leaning away from the second row of pins. As the bar moves in the reciprocating motion toward the third row of pins and away from the first row of pins, the upper end portions of the pins of the first row now tend to return to their intial position of leaning toward the second row of pins, but actually only spring to a generally straightened position. After the support table has completed its reciprocating movement in the "Y" direction, the upper end portions of the pins of the second row also are left leaning slightly in the "Y" direction toward the third row of pins. In this way, the upper end portions of the pins of the first row are now generally straight but the upper end portions of the pins of the second row are leaning in the "Y" direction toward the pins of the third row.

This pattern of operation then is continued until the upper end portions of all of the pins of the board have been straightened in the "X" and "Y" directions. The board then may be inverted in the apparatus and the end portions of the pins projecting from the opposite side of the board may be straightened in the same manner.

U.S. Pat. No. 3,779,291 to H. G. Yeo also reveals a pin-straightening machine for straightening simultaneously portions of all of the pins of a multiple-pin board (backplane) projecting from one side of the board, after the pins have been secured to the board. The board-secured pins are simultaneously located in holes of a plate whereafter relative motion is provided between the plate and the board. The motion is timed and controlled as to the amount, direction and sequence of relative motion imparted. Ultimately, axial deformity of any of the pins is corrected.

More specifically, the machine disclosed in the Yeo U.S. Pat. No. 3,779,291 initially requires that the board be positioned so that the pins can be inserted face down through apertures of a fixed plate. Once the pins have been inserted through the apertures of the fixed plate, the tips of the pins are located within apertures of a movable grid plate concealed within an enclosure of an operating table. After the tips of the pins have been inserted into the apertures of the grid plate, a cover is lowered over the upwardly facing side of the board and clamped in the closed position by latches. A resilient facing pad, located on the inner surface of the cover, is positioned in engagement with the upwardly facing side of the board. The grid plate is then selectively moved in a variety of directions to effect the straightening of the pins.

Accordingly, a primary purpose of this invention is to provide a new and improved method and apparatus in which opposite end portions of a row of terminal pins in a board are straightened simultaneously, as the row of pins is inserted into the board.

SUMMARY OF THE INVENTION

In general, this invention is directed to the straightening of an elongated pin having an intermediate portion inserted into a substrate and having first and second opposite end portions extending outwardly from the substrate. In a straightening operation, relative movement is caused between the intermediate portion of the pin and the end portions of the pin to flex and coldwork the first and second end portions of the pin in a lateral direction simultaneously.

More specifically, a plurality of the pins are gripped in a gripping means on one side of the substrate and relative movement is caused between the gripping means and the substrate to insert the intermediate portions of the pins into the substrate. As the pins are inserted into the substrate, the second opposite end portions of the pins are extended into a straightening means on the opposite side of the substrate. Subsequently, the first end portions of the pins are partially withdrawn from the gripping means such that only tip portions of the pins are disposed in retaining means of the gripping means, and the second end portions of the pins are partially withdrawn from the straightening means such that only tip portions of the pins are disposed in retaining portions of the straightening means. In straightening the pins, relative reciprocating movement is caused between the intermediate portions of the pins in the substrate and the tip portions of the pins to flex and coldwork the first and second end portions of the pins in a lateral direction simultaneously. After the first and second end portions of the pins have been coldworked, the tip portions of the pins are withdrawn from the retaining portions of the gripping means and the straightening means.

BRIEF DESCRIPTION OF THE DRAWINGS

FIG. 1 is an elevation view of a terminal pin insertion and straightening apparatus in accordance with the principles of this invention;

FIG. 2 is a perspective view showing a plurality of pins inserted into a printed wiring board;

FIG. 3 is a view of a portion of a terminal pin strip;

FIG. 4 is a view similar to FIG. 3 showing terminals of FIG. 3 assembled in a printed wiring board;

FIG. 5 is a cross-sectional view taken along line 5—5 of FIG. 1;

FIG. 6 is a cross-sectional view taken along line 6—6 of FIG. 5;

FIG. 7 is an enlarged cross-sectional view taken along the centerline of a clamping mechanism of the apparatus;

FIG. 8 is a cross-sectional view taken along line 8—8 of FIG. 7;

FIG. 9 is an enlarged cross-sectional view illustrating an intermediate step in straightening pins in accordance with this invention; and FIGS. 10-19 are schematic views illustrating a sequence of processing steps in accordance with this invention.

DETAILED DESCRIPTION

Referring to FIGS. 1, 2 and 3, a pin insertion apparatus 20 (FIG. 1) as described in copending application Ser. No. 965,219 filed Nov. 30, 1978, in the name of William Martin Chisholm and assigned to the same assignee, the disclosure of which is incorporated herein by reference, has been modified to simultaneously straighten opposite end portions of a plurality of terminal pins 22 which have been inserted into a printed wiring board or substrate 24.

Referring to FIG. 3, prior to insertion into the printed wiring board 24, bodies of the terminal pins 22 are linked together intermediate free insertion end portions 22i and free connector end portions 22c by webs 26 to form a terminal pin strip 28. The webs 26 are provided with prepunched openings 26a to reduce the cross-sectional area which must be sheared during a web severing operation, thus facilitating separation of the webs from the terminal pins 22. The openings 26a also define push shoulders 22ps on planar intermediate portions of each of the terminal pins 22 in the plane of the intermediate portions, to facilitate insertion of the terminal pins into apertures 30 (FIG. 4) of the printed wiring board 24, as shown in FIG. 2, without engaging and damaging the connector end portions 22c of the pins. The terminal pins 22 also include intermediate planar blade-type orienting or aligning portions 22b adjacent the webs 26, having opposite planar surfaces 22p and parallel side edges 22s. The terminal pins 22 further include intermediate compliant sections 22cs of a known type having an essentially U-shaped cross section for retaining the terminal pins in the printed wiring board 24.

In the terminal pin insertion operation, a removable apertured plastic guide plate 32 may be suitably mounted over the printed wiring board 24, as illustrated in FIG. 4, to facilitate insertion of the compliant sections 22cs of the terminal pins 22 in the printed wiring board apertures 30. By way of illustration, the guide plate 32 may include a series of terminal pin-receiving slots 32s having suitable guide surfaces, such as a pair of inverted conically-shaped guide grooves 32g located on opposite sides of each slot for guiding tips of the insertion end portions 22i of the terminal pins 22 into alignment with the apertures 30 in the printed wiring board 24.

In general, with reference to the terminal pin strip 28 of FIG. 3, and referring to FIG. 1, the above-mentioned apparatus as disclosed in copending application Ser. No. 965,219, for assembling a plurality of the terminal pins 22 into the printed wiring board 24, may include a pair of supply reels 34-1 and 34-2 each having one of the terminal pin strips 28 mounted thereon. In an assembling operation the terminal pins 22 of the terminal pin strips 28 are fed alternately in sets from the supply reels 34-1 and 34-2 under the direction of a controller (not shown) by respective first and second pin transporter mechanisms 36-1 and 36-2 into associated punch-and-die mechanisms 38-1 and 38-2 for severing of the webs 26 (FIG. 3) from between the terminal pins. Each pin transporter 36-1 or 36-2 then transfers the severed terminal pins 22 to a pin insertion device in the form of a rotatable turret 40. Upon withdrawal of the pin transporter 36-1 or 36-2 from the turret 40, the turret is rotated 90° to dispose the set of terminal pins 22 inserted therein by the pin transporter mechanism in a vertical orientation in a pin-insertion position as shown in FIG. 1. The printed wiring board 24 then is moved upward by an X, Y, Z traversing mechanism 42 so that the terminal pins 22 are inserted (received) in respective ones of the apertures 30 (FIG. 4) in the printed wiring board.

As is shown in FIG. 1, the turret 40 is fixedly mounted on a horizontal shaft 44 rotatably mounted in the lower ends of a pair of depending brackets 46 suitably secured at their upper ends to a support plate 48. The support plate 48 is mounted at opposite ends on the upper ends of a pair of upstanding support posts 50 suitably secured at their lower ends to a platform 52. The left-hand end of the shaft 44, as viewed in FIG. 1, is suitably connected to an indexing drive motor (not shown) mounted on the platform 52.

Referring to FIGS. 1, 7 and 8, a plurality of turret clamping or gripping mechanisms 54, into which the terminal pins 22 are inserted by the pin transporters 36-1 and 36-2, are suitably mounted on the rotatable turret 40 at 90° intervals. Each turret clamping mechanism 54 includes a plurality of spaced parallel sets of opposed resilient clamping fingers 56 wherein each set of the clamping fingers includes opposed slots 56e, for receiving the blade-type orienting portion 22b of a respective one of the terminal pins 22 so as to confine the pin against movement. Each set of the resilient clamping fingers 56 also includes a circular passageway 56p formed in the clamping mechanism 54 for receiving the connector end portion 22c of the terminal pin 22.

Referring to FIGS. 1, 5 and 6, the above-mentioned apparatus as disclosed in copending application Ser. No. 965,219 has been modified so that opposite sides of the printed wiring board 24 and the guide plate 32 are supported in the apparatus on a pair of upwardly projecting legs 57 of a U-shaped support member (or assembly) 58, with the U-shaped support defining an open area beneath the printed wiring board. By way of example, the opposite sides of the printed wiring board 24 and the guide plate 32 may be disposed in opposed recesses in the upper ends of the support legs 57 as shown in FIGS. 5 and 6, and held clamped in the recesses in a suitable manner, not shown. As in the apparatus disclosed in the copending application Ser. No. 965,219, the support 58 is fixedly mounted on a Y-slide 60 of the X, Y, Z traversing mechanism 42. The Y-slide 60 is slidably mounted for horizontal movement along a guideway of an X-slide 62 and is driven by a motor (not shown) mounted on the X-slide and connected to the Y-slide by a drive screw 63 (FIG. 1). The X-slide 62 is mounted for horizontal movement along a guideway of a vertically movable table 64, and is driven by a motor 66 (FIG. 1) mounted on the table and connected to the X-slide by a drive screw 68 (FIG. 1). The table 64 is mounted for vertical movement by suitable guide bushings on vertical guide rods 70 extending between the platform 52 (FIG. 1) and a base plate 72 (FIG. 1).

With further reference to FIGS. 1, 5 and 8, the above-mentioned apparatus as disclosed in copending application Ser. No. 965,219 has been further modified to include a straightening bar 74 which extends through the open area defined by the U-shaped support 58 beneath the printed wiring board 24, and which cooperates with the resilient fingers 56 of the terminal pin-insertion turret 40 (FIG. 1) to facilitate straightening the connector end portions 22c and the insertion end portions 22i of the terminal pins 22 simultaneously. A central portion of the straightening bar 74 has a row of apertures 76 (FIG. 5) formed therein, which receive the insertion end portions 22i of the terminal pins 22 therethrough as the pins are extended through the apertures 30 in the printed wiring board 24 during a pin insertion operation, as illustrated in FIG. 4. Referring to FIG. 5, the straightening bar 74 also has enlarged opposite end sections 78, including transversely extending arm members 80 secured to the end sections. Adjacent its opposite ends each arm member 80 is mounted for vertical movement on a pair of guide rods 82 (FIGS. 1 and 5) which extend between the platform 52 of the apparatus 20 and the base plate 72 thereof, thereby mounting the straightening bar for vertical movement relative to the printed wiring board support 58.

The open area defined by the U-shaped support 58 below the printed wiring board 24 permits the straightening bar 74 to move freely upwardly and downwardly beneath the board and to permit the Y-slide 60 to move in the "Y" direction without striking the straightening bar. The straightening bar 74 is vertically movable by air cylinders 84 (FIG. 1) mounted on and depending from the platform 52 and having piston rods 86 (FIGS. 1, 5 and 8) secured to the enlarged end sections 78 of the bar. The vertical position of the straightening bar 74 relative to the printed wiring board 24 may be controlled by a series of vertically disposed position indicating switches 88 mounted on a bracket 90 depending from the platform 52 and connected to the above-mentioned controller (not shown) for the apparatus, in a known manner. Similarly, the vertical position of the X, Y, Z traversing mechanism 42 and the printed wiring board 24, relative to the turret 40, may be controlled by a series of vertically disposed position indicating switches 92 mounted on a vertical back wall of the apparatus between the platform 52 and the base plate 72.

In the terminal pin insertion-straightening method of this invention, the terminal pins 22 in each row of the pins extending in an "X" direction can be inserted into the printed board 24 and flex-straightened simultaneously, as subsequently described herein. In the alternative, where the spacing of the terminal pins 22 in an X-direction, or the spacing between sets of the pins in an X-direction, will permit insertion and flex-straightening of the pins in the X-direction without disturbing the straightness of any previously-inserted pins, the terminal pins in each row of the pins extending in the X-direction can be inserted and straightened in sets, if so desired.

In a terminal pin insertion operation, a set of the terminal pins 22 in a first one of the clamping mechanisms 54 of the turret 40 is inserted into the printed wiring board 24 by upward operation of the X, Y, Z traversing mechanism 42, which raises the board relative to the turret to cause the pins to be inserted (received) into the apertures 30 of the board, as above described. At the same time, in accordance with this invention the straightening bar 74, which is located in an uppermost position immediately below the printed wiring board 24, also is moved upward with the board by operation of the air cylinders 84 so that as the pins 22 are inserted into the apertures 30 of the board, the insertion end portions 22i of the pins are also extended into the apertures 76 of the straightening bar 74 as depicted in FIGS. 4 and 10.

After insertion of the terminal pins 22 in the printed wiring board 24, the board is moved vertically downward relative to the turret 40 by downward operation of the air cylinders 92 of the X, Y, Z traversing mechanism 42, to an intermediate position as shown in FIGS. 9 and 11, wherein only tip portions of the connector end portions 22c of the pins 22 extend into enlarged portions of the circular passageways 56p (FIG. 8) in the resilient clamping fingers 56. Simultaneously, the straightening bar 74 is lowered relative to the undersurface of the board 24 by downward operation of the air cylinders 84, to an intermediate position as shown in FIGS. 9 and 11, such that only tip portions of the insertion end portions 22i of the pins 22 extend into the respective apertures 76 of the straightening bar, as shown in FIGS. 9 and 11.

The printed wiring board 24 is then reciprocated in the "X" direction (into and out of the paper in FIG. 10) one or more times relative to the straightening bar 74 and the resilient fingers 56 of the turret 40, by operation of the X, Y, Z traversing mechanism 42, to flex and coldwork the connector end portions 22c (including portions of the planar blade portions 22b) and the insertion end portions 22i of the inserted pins 22 in an "X" plane. In this regard, the apertures 76 of the straightening bar 74 preferably are of the same diameter as the enlarged portions of the circular passageways 56p in the resilient fingers 56 so that the connector ends 22c and the insertion ends 22i of the pins 22 are coldworked essentially uniformly. When the coldworking of the pins 22 in the "X" plane has been completed, the X-drive motor (not shown) is deenergized so that the pins remain in their initial perpendicular orientation relative to the board 24 in the "X" plane.

Referring to FIGS. 12 and 13, the printed wiring board 24 is then reciprocated one cycle in the "Y" direction relative to the straightening bar 74 and the resilient clamping fingers 56 of the turret 40, by operation of the Y-drive motor of the X, Y, Z traversing mechanism 42, to flex and coldwork the connector end portions 22c and the insertion end portions 22i of the terminal pins 22 in a "Y" plane. After the reciprocation of the board 24 and the pins 22 in the "Y" direction, the board is stopped such that the connector end portions 22c and the insertion end portions 22i of the pins are leaning to the left as depicted in FIG. 13. The connector end portions 22c of the pins 22 are then withdrawn from the clamping fingers 46 of the turret 40 by operation of the air cylinders 92 of the X, Y, Z mechanism 42 to lower the board 24 to its initial lower starting position, while simultaneously the straightening bar 74 is lowered to a lowermost position and retracted from the insertion ends 22i of the pins by operation of the air cylinders 84, as illustrated in FIG. 14. The end portions 22c and 22i of the pins 22 thus are purposely left leaning slightly in the "Y" plane as shown in the FIG. 14 towards the row of board apertures 30 which will receive the next row of pins.

After one set of the terminal pins 22 has been inserted into the printed wiring board 24 from the supply reel 34-1 (FIG. 1) as above described, in the disclosed embodiment of the invention the Y-slide 60 of the X,Y, Z traversing mechanism 42 is indexed horizontally to locate a next row of the apertures 30 in the printed wiring board 24 in position for reception of a set of the terminal pins 22. The straightening bar 74 then is returned to its upper position immediately below the printed wiring board 24 by operation of the air cylinders 84. A next set of the terminal pins 22, from the supply reel 34-2, then is inserted into the positioned printed wiring board apertures 30 from a second one of the turret clamping mechanisms 54 in a manner as above described and as depicted in FIG. 15.

With specific reference to FIG. 15, the connector end portions 22c and the insertion end portions 22i of the terminal pins 22 of the first-inserted row of pins have been straightened in the "X" direction but are leaning slightly in the "Y" plane towards the second-inserted row of pins, as above described. Further, tip portions of the connector end portions 22c and the insertion end portions 22i of the second-inserted pins 22, as a result of the lowering of the printed wiring board 24 and the straightening bar 74 as above described, have been located within the enlarged portions of the circular passageways 56p of the second turret clamping mechanism 54 and the straightening bar apertures 76, respectively. The board 24 is then reciprocated in the "X" direction one or more times to coldwork the second-inserted pins 22 in the "X" plane and thereby straighten these pins in the "X" plane as above described. Then, as the board 24 is reciprocated in the "Y" direction one cycle to straighten the second-inserted pins 22 in the "Y" plane, one side of the straightening bar 74 and one side of the second turret clamping mechanism 54 initially engage the slightly bent pins of the first row of pins and bend the pins in the "Y" plane so that the end portions 22c and 22i of the pins are now leaning away from the second row of pins, as shown in FIG. 17. When the board 24 then is moved in the opposite direction to bend the second row of the pins 22 in the opposite direction, the end portions 22c and 22i of the pins 22 of the first row of pins tend to spring back towards their initial positions in which they lean towards the second row of pins, but actually will return only to a generally straightened position perpendicular to the board 24 as shown in FIG. 18.

The X, Y, Z traversing mechanism 42 then is again retracted from the turret 40 and the straightening bar 74 is retracted from the printed wiring board 24, to the positions as shown in FIG. 19, leaving the end portions 22c and 22i of the second row of pins leaning slightly in the Y-plane, towards the row of apertures 30 in the board which is to receive the next row of pins. The foregoing pin-insertion operation then is repeated until all of the pins 22 have been inserted into the board 24 and straightened as above described.

In summary, an apparatus 20 is disclosed which facilitates straightening opposite end portions 22c and 22i of a plurality of terminal pins 22 extending from opposite sides of a printed wiring board 24, in conjunction with the insertion of the pins into the board. In this regard, a set of the pins 22 is first inserted into the board 24 as illustrated in FIGS. 4 and 10, by moving the X, Y, Z traversing mechanism 42 (FIG. 1) vertically to move the board 24 upward toward one of the clamping mechanisms 54 of the insertion turret 40, which has a plurality of the pins extending downward from the clamping fingers 56 thereof in the pin-insertion position. As the X, Y, Z traversing mechanism 42 is moved upward, the straightening bar 74, which is located immediately below the printed wiring board 24, also is moved upward by the air cylinders 84 (FIG. 1) with the board so as to receive the insertion end portions 22a of the inserted pins 22 into respective ones of the apertures 76 of the bar, as illustrated in FIGS. 4 and 10. After the pins 22 have been inserted into the board 24, the board is moved downward from the first turret clamping mechanism 54 such that only the tips of the connector end portions 22c of the pins extend into the enlarged portions of the circular passageways 56p of the clamping mechanism resilient fingers 56, as illustrated in FIG. 11. Simultaneously, the straightening bar 74 is retracted from the undersurface of the board 24 by the air cylinders 84 such that only the tips of the insertion end portions 22i of the pins 22 extend into the apertures 76 of the straightening bar, as illustrated in FIG. 11. The board 24 is then reciprocated one or more times in the "X" direction (into and out of the paper in FIG. 11) to coldwork the end portions 22c and 22i of the pins 22, thus straightening the pins in the "X" plane. After the reciprocation in the "X" direction the board 24 is reciprocated in the "Y" direction one cycle to coldwork the end portions 22c and 22i of the pins 22 in the "Y" plane, as illustrated in FIGS. 12 and 13. The end portions 22c and 22i of the pins 22 then are purposely left leaning in the "Y" plane towards the row of apertures 30 which will receive the next row of inserted pins, as illustrated in FIG. 14.

The X, Y, Z traversing mechanism 42 is then indexed to position the next set of apertures 30 in the printed wiring board 24 in the pin-insertion position beneath a second one of the turret clamping mechanisms 54 which has been rotated into the pin-insertion position. After the next row of the terminal pins 22 has been inserted into the board 24 (FIG. 14), the board and the straightening bar 74 are again lowered so that only the tips of the pins are received in the resilient fingers 56 and the bar, as illustrated in FIGS. 8 and 15. The board 24 then is again reciprocated in the "X" direction (into and out of the paper in FIG. 15) one or more times to coldwork and straighten the pins 22 in the X-plane as above described.

The board 24 then is reciprocated in the "Y" direction one cycle to coldwork the just-inserted pins 22 in a Y-plane, as illustrated in FIGS. 16 and 17. During this coldworking operation, when the board 24 is moved to the left as illustrated in FIG. 17, sides of the straightening bar 74 and the second clamping mechanism 54 adjacent the first row of pins 22 engage the slightly bent pins of the row and bend them in a reverse direction to the right in the Y-plane. When the board 24 is moved to the right in the coldworking operation, as illustrated in FIG. 18, the pins 22 of the first row of pins tend to return to their initial leaning positions, but actually will return only to a generally straightened position perpendicular to the board 24 as illustrated in FIG. 18. The board 24 and the straightening bar 74 then are further lowered as illustrated in FIG. 19, to retract the pins 22 from the turret clamping mechanism 54 and the bar, leaving the end portions 22c and 22i of the second row of pins leaning slightly in a Y-plane as shown in that figure. This inserting-and-straightening operation then is repeated until all of the pins 22 have been inserted into the board 24 and then straightened in conjunction with the insertion operation.

What is claimed is:

1. A method of straightening an elongated pin having an intermediate portion and first and second opposite end portions, comprising the steps of:

gripping the pin in a gripping means;

causing relative movement between a substrate and the gripped pin to insert the pin into the substrate;

maintaining the gripping means about at least a tip portion of the first end portion; and causing relative reciprocating movement between the intermediate portion of the pin in the substrate and tip portions of the first and second opposite end portions of the pin to flex and coldwork the first and second opposite end portions of the pin in a lateral direction is simultaneously.

2. The method as recited in claim 1, in which:

the tip portions of the first and second opposite end portions of the pin are retained against substantial lateral movement; and the intermediate portion of the pin and the substrate are reciprocated relative to the tip portions to flex and coldwork the first and second opposite end portions of the pin in a lateral direction simultaneously.

3. The method as recited in claim 1, which further comprises the step of:

causing partial withdrawal of the inserted pin from the gripping means subsequent to the inserting of the pin in the substrate and prior to the causing of reciprocating movement such that only the tip portion of the first end portion of the pin is disposed in the gripping means for flexing and coldworking of the first end portion of the pin.

4. The method as recited in claim 3, which further comprises the steps of:

extending the second end portion of the pin through a straightening means on the opposite side of the substrate as the pin is inserted into the substrate; and causing partial withdrawal of the inserted pin from the straightening means such that only the tip portion of the second end portion of the pin is disposed in the straightening means for flexing and coldworking the second end portion of the pin.

5. The method as recited in claim 4, which further comprises:

causing total withdrawal of the first and second end portions of the inserted pin from the gripping means and the straightening means, respectively, after the first and second end portions of the pins have been flexed and coldworked.

6. A method of inserting an elongated pin into a substrate and straightening the pin, comprising the steps of:

gripping the pin in a gripping means on one side of the substrate;

causing relative movement between the substrate and the gripped pin to insert the pin into the substrate;

causing partial withdrawal of the inserted pin from the gripping means such that only a tip portion of the pin is disposed in the gripping means; and causing relative reciprocating movement between the substrate and the tip portion of the pin to flex and coldwork the pin in a lateral direction.

7. A method of inserting an elongated pin into a substrate and straightening the pin, comprising the steps of:

inserting the pin into the substrate from one side of the substrate such that the pin projects from the opposite side of the substrate;

extending the pin through a straightening means on the opposite side of the substrate as the pin is inserted into the substrate;

causing partial withdrawal of the inserted pin from the straightening means such that only a tip portion of the pin is disposed in the straightening means; and causing relative reciprocating movement between the substrate and the tip portion of the pin to flex and coldwork the pin in a lateral direction.

8. A method of inserting a plurality of pins into a substrate and straightening the pins simultaneously, comprising the steps of:

gripping first end portions of the pins in a gripping means on one side of the substrate;

causing relative movement between the substrate and the gripping means to insert intermediate portions of the pins into the substrate simultaneously;

extending second opposite end portions of the pins through a straightening means on the opposite side of the substrate as the pins are inserted into the substrate;

causing partial withdrawal of the inserted pins from the gripping means such that only tip portions of the first end portions of the pins are disposed in retaining portions of the gripping means;

disposing only tip portions of the second end portions of the pins in retaining portions of the straightening means;

causing relative reciprocating movement between the intermediate portions of the pins in the substrate and the tip portions of the pins to flex and coldwork the first and second end portions of the pins in a lateral direction simultaneously; and causing relative movement between the substrate and the gripping means, and between the substrate and the straightening means, after the first and second end portions of the pins have been flexed and coldworked, to withdraw the tip portions of the pins from the retaining portions of the gripping means and the straightening means.

9. Apparatus for straightening an elongated pin having an intermediate portion and first and second opposite end portions, comprising:

a substrate having a plurality of apertures formed therein;

means for supporting the substrate;

means for gripping the pin;

means for causing relative movement between the supporting means and the gripping means to insert the pin into the substrate;

means for maintaining the gripping means about at least a tip portion of the first end portion of the pin on one side of the supporting means;

pin-receiving means located on the opposite side of the supporting means from the gripping means for receiving the tip portion of the second opposite end portion of the pin; and reciprocating means for causing relative reciprocating movement between the supporting means and the gripping means and second pin-receiving means, to flex and coldwork the first and second opposite end portions of the pin in a lateral direction simultaneously.

10. Apparatus as recited in claim 9, in which:

the pin-receiving means retains the tip portions of the first and second opposite end portions of the pins against substantial lateral movement; and the reciprocating means reciprocates the substrate support means relative to the pin-receiving means to flex and coldwork the first and second opposite end portions of the pin in a lateral direction simultaneously.

11. Apparatus as recited in claim 9, which further comprises:

means for causing relative movement between the supporting means and the gripping means to partially withdraw the inserted pin from the gripping means subsequent to the insertion of the pin into the substrate and prior to the causing of reciprocating movement such that only the tip portion of the first end portion of the pin is disposed in the first pin-receiving means for flexing and coldworking of the first end portion of the pin.

12. Apparatus as recited in claim 11, wherein the second pin-receiving means is movable relative to the substrate support means into a position such that the second end portion of the pin extends into the second pin-receiving means when the pin is inserted into the substrate.

13. Apparatus as recited in claim 12, which further comprises:

means for causing relative movement between the substrate support means and the second pin-receiving means to partially withdraw the inserted pin from the second pin-receiving means such that only the tip portion of the second end portion of the pin is disposed in the second pin-receiving means for flexing and coldworking of the second end portion of the pin.

14. Apparatus as recited in claim 13, which further comprises:

means for causing relative movement between the substrate support means and the gripping means to withdraw the inserted pin from the gripping means; and means for causing relative movement between the substrate support means and the second pin-receiving means to withdraw the inserted pin from the second pin-receiving means.

15. Apparatus as recited in claim 14, wherein the second pin-receiving means is a bar having an aperture wherein for receiving the second end portion of the pin.

16. Apparatus as recited in claim 14, wherein the gripping means has opposed resilient fingers for releasably gripping the pin.

17. Apparatus for inserting an elongated pin into a substrate and straightening the pin, comprising:

means for supporting the substrate;

means for gripping the pin on one side of the substrate support means;

means for causing relative movement between the substrate support means and the gripping means to insert the pin into the substrate;

means for causing relative movement between the substrate support means and the gripping means to partially withdraw the inserted pin from the gripping means such that only a tip portion of the pin is disposed in the gripping means; and means for causing relative reciprocating movement between the substrate support means and the gripping means to flex and coldwork the pin in a lateral direction.

18. Apparatus for inserting an elongated pin into a substrate and straightening the pin, comprising:

means for supporting the substrate;

means for inserting the pin into the substrate from one side of the substrate and the substrate support means such that the pin projects from the opposite side of the substrate;

straightening means on the opposite side of the substrate support means for receiving the pin as the pin is inserted into the substrate;

means for causing relative movement between the substrate support means and the straightening means to cause partial withdrawal of the pin from the straightening means so as to dispose only a tip portion of the pin in the straightening means; and means for causing relative reciprocating movement between the substrate support means and the straightening means to flex and coldwork the pin in a lateral direction.

19. Apparatus for inserting a plurality of pins in a substrate and straightening the pins simultaneously, comprising:

means for supporting the substrate;

means for gripping first end portions of the pins, said gripping means being positioned on one side of the substrate support means;

straightening means positioned on an opposite side of the substrate support means for straightening second end portions of the pins;

means for causing relative movement between the substrate support means and the gripping means to insert the pins into the substrate simultaneously;

means for causing relative movement between the substrate support means and the gripping means to partially withdraw the inserted pins from the gripping means, such that only tip portions of the first end portions of the of the pins are disposed in the gripping means;

means for causing relative movement between the substrate support means and the straightening means to cause only tip portions of the second opposite end portions of the pins to be disposed in the straightening means;

means for causing relative reciprocating movement between the substrate support means and the gripping means, and between the substrate support means and the straightening means, to flex and coldwork the first and second end portions of the pins in a lateral direction simultaneously;

means for causing relative movement between the substrate support means and the pin gripping means to remove the first end portions of the pins from the gripping means; and means for causing relative movement between the substrate support means and the straightening means to remove the second end portions of the pins from the straightening means.

* * * * *

UNITED STATES PATENT AND TRADEMARK OFFICE
CERTIFICATE OF CORRECTION

PATENT NO. : 4,372,044
DATED : February 8, 1983
INVENTOR(S) : William M. Chisholm It is certified that error appears in the above—identified patent and that said Letters Patent are hereby corrected as shown below:

In the specification, Column 9, line 17, change "22a" to --22i--.

In the claims, Column 10, line 26, after "direction", delete --is--. Column 12, line 60, change "wherein" to --therein--.

Signed and Sealed this

Sixth Day of September 1983

[SEAL]

Attest:

GERALD J. MOSSINGHOFF

Attesting Officer   Commissioner of Patents and Trademarks